United States Patent
Briggs et al.

(10) Patent No.: US 8,164,390 B1
(45) Date of Patent: Apr. 24, 2012

(54) REGULATING AN OPERATING CONDITION OF AN INTEGRATED CIRCUIT TO COMPENSATE FOR A MANUFACTURING VARIATION

(75) Inventors: Randall D. Briggs, Boise, ID (US); Eran Maor, Nes-Ziona (IL); Walter Lee McNall, Meridian, ID (US); William B. Weiser, Meridian, ID (US); Haggai Telem, Moshav Lachish (IL)

(73) Assignees: Marvell International Ltd., Hamilton (BM); Marvell Israel (MISL) Ltd., Yokneam (IL)

( * ) Notice: Subject to any disclaimer, the term of this patent is extended or adjusted under 35 U.S.C. 154(b) by 531 days.

(21) Appl. No.: 12/048,957

(22) Filed: Mar. 14, 2008

Related U.S. Application Data (60) Provisional application No. 60/894,793, filed on Mar. 14, 2007, provisional application No. 60/895,567, filed on Mar. 19, 2007, provisional application No. 60/947,535, filed on Jul. 2, 2007.

(51) Int. Cl.
*H03L 7/081* (2006.01)
(52) U.S. Cl. ............ 331/25; 327/161; 327/291; 331/1 R
(58) Field of Classification Search .................... 331/57, 331/44, 185, 186, 34, 16, 25, 1 A, 7, 345; 324/763, 765; 323/285, 282; 327/156, 158, 327/161, 231, 237, 243, 244, 261, 262, 291; 714/4, 5, 6
See application file for complete search history.

(56) References Cited

U.S. PATENT DOCUMENTS

| | | | |
|---|---|---|---|
| 6,262,634 B1 * | 7/2001 | Flanagan et al. | 331/25 |
| 6,668,346 B1 | 12/2003 | Schulz et al. | |
| 6,853,177 B2 | 2/2005 | Shibayama et al. | |
| 7,355,380 B2 * | 4/2008 | Abuhamdeh et al. | 324/76.54 |
| 7,579,886 B2 * | 8/2009 | Hufford et al. | 327/156 |
| 2004/0108866 A1 | 6/2004 | Burns et al. | |
| 2005/0001600 A1 * | 1/2005 | Morales | 323/282 |
| 2005/0218871 A1 * | 10/2005 | Kang et al. | 323/265 |

OTHER PUBLICATIONS

*Extended Temperature Support for Cyclone Devices*, ALTERA White Paper, ver. 1.1, 2 pages, Jul. 2004.
*How Do Dallas Semiconductor Delay Lines Work?*, Dallas Semiconductor MAXIM, 4 pages, Aug. 12, 2002.
*LM117/LM317A/LM317 3-Terminal Adjustable Regulator*, National Semiconductor, 26 pages, Jun. 2006.
*Tower Semiconductor adopts Legend's CharFlo-Memory!™ for quality assurance of commercially available memory compilers*, EDA Weekly, 2 pages, Jul. 28, 2005.

* cited by examiner

*Primary Examiner* — Ryan Johnson (57) ABSTRACT

An integrated circuit has operational circuitry to perform an operation. An operational regulator regulates an operating condition of the operational circuitry. The operational regulator has a sample clock to generate a sample clock signal. The sample clock signal correlates to a manufacturing variation of the electronic circuitry. The operational regulator also includes a configurator to evaluate the sample clock signal and generate a configuration signal according to the evaluation. A controller is provided to receive the configuration signal and control an operating condition of the operational circuitry according to the configuration signal.

18 Claims, 4 Drawing Sheets

REGULATING AN OPERATING CONDITION OF AN INTEGRATED CIRCUIT TO COMPENSATE FOR A MANUFACTURING VARIATION

RELATED APPLICATIONS

The present application claims the benefit of priority of U.S. Provisional Application No. 60/894,793, filed Mar. 14, 2007, entitled "Compensating for Slow/Fast Process Corners by Increasing Voltage and Configuring Feedback Delay of a PLL," U.S. Provisional Application No. 60/895,567, filed Mar. 19, 2007, entitled "Compensating for Slow/Fast Process Corners by Increasing Voltage and Configuring Feedback Delay of a PLL," and U.S. Provisional Application No. 60/947,535, filed Jul. 2, 2007, entitled "DRO Controlled Voltage Supply." These provisional applications are expressly incorporated herein by reference in their entireties.

TECHNICAL FIELD

This invention generally relates to regulating an operating condition of an integrated circuit to compensate for one or more variations in the process of manufacturing the integrated circuit, and to integrated circuits that are regulated thereby.

BACKGROUND

Integrated circuits are typically manufactured in quantity and supplied for one or more industrial applications. However, when multiple integrated circuits of a particular design are manufactured, variations in the manufacturing conditions often result in performance differences among the individual integrated circuits. For example, one integrated circuit may be able to perform at a higher clock speed than another integrated circuit. The integrated circuits may also generate different amounts of excess heat and consume different amounts of power during operation despite receiving substantially the same input signals and operating in substantially the same environmental conditions.

In order to efficiently ensure that an integrated circuit from a group will operate within a window of operating parameters of an application, the application may be designed for the worst-case scenario of the integrated circuit for each operating parameter. For example, the application may assume that the integrated circuit has the lowest speed within the range of expected speeds resulting from variations in the manufacturing conditions. Separately, the application may also assume that the integrated circuit generates the greatest amount of excess heat that could result from variations in the manufacturing conditions.

These variations among the integrated circuits may require certain precautions to be taken for the benefit of a relatively small number of integrated circuits in the group. For example, the application may be designed to operate at a sufficiently low speed so that an acceptably high yield of manufactured circuits can be expected to function at that speed. Furthermore, the integrated circuits may be housed in packages with higher capacity to dissipate excess heat in order to avoid possible overheating. However, packages having a higher heat dissipation capacity tend to cost more than their less robust counterparts. Variations in the manufacturing conditions of the integrated circuits can therefore have a negative impact on the application that uses the integrated circuit, such as in terms of speed, cost, reliability, and power consumption.

SUMMARY

An operational regulator is provided for regulating an operating condition of an integrated circuit in response to a measured attribute of the integrated circuit. In accordance with an embodiment, measurement and regulation are done in real time. The operational regulator comprises a sample clock to generate a sample clock signal, the sample clock signal correlating to a manufacturing variation of an integrated circuit. A configurator is provided to evaluate the sample clock signal and generate a configuration signal for a controller according to the evaluation. The controller is adapted to control an operating condition of the integrated circuit, for example a supply voltage or a clock phase delay, according to the configuration signal.

In another aspect, an integrated circuit is configured to include an operational regulator for regulating an operating condition as described above.

In yet another aspect, a method is provided for regulating an operating condition of an integrated circuit. The method comprises generating a sample clock signal that correlates to a manufacturing variation of the integrated circuit. The method further comprises evaluating the sample clock signal and generating a configuration signal according to the evaluation. An operating condition of the integrated circuit is controlled according to the configuration signal.

BRIEF DESCRIPTION OF THE DRAWINGS

The accompanying drawings, which are incorporated in and constitute a part of this specification, illustrate embodiments and teach principles consistent with the presently claimed invention. In the drawings:

DESCRIPTION OF THE EMBODIMENTS

Reference will now be made in detail to embodiments consistent with the presently claimed invention, examples of which are illustrated in the accompanying drawings. Wherever possible, the same reference numbers will be used throughout the drawings to refer to the same or like parts.

Electronic circuitry may be implemented in the form of an integrated circuit (IC) to perform one or more operations. The integrated circuit may be fabricated by processing and fabricating layers on a silicon or other suitable semiconductor wafer. Multiple integrated circuits may be formed substantially simultaneously, such as by using a single wafer as a substrate for multiple instances of an integrated circuit having substantially the same design. The integrated circuits may be tested on the wafer and the individual integrated circuits may then be separated by cutting the wafer. Each of the integrated circuits may be housed in a package to facilitate connection of the integrated circuit to external electronics. For example, the IC package may be coupled to a printed circuit board (PCB) to permit connection of the integrated circuit to other electronics on the PCB.

Variations in the manufacturing conditions among the integrated circuits may result in performance differences among the individual integrated circuits. These manufacturing conditions may include processing conditions, such as conditions of etching or chemical-mechanical polishing (CMP), and fabrication conditions, such as conditions of thin-film deposition. These manufacturing conditions may vary across individual integrated circuits in the same batch. Alternatively, the manufacturing conditions may vary across different batches of integrated circuits where each batch of integrated circuits was manufactured substantially simultaneously, such as if each batch of integrated circuits has been manufactured on a single semiconductor wafer.

The net effect of the manufacturing conditions on the operating speed of the integrated circuit may be represented by a manufacturing parameter ("M"). A set of manufacturing conditions that results in a relatively slow operating speed is referred to as a "slow" value of the manufacturing parameter (M), while a set of manufacturing conditions that results in a relatively fast operating speed is referred to as a "fast" value of the manufacturing parameter (M). The operating speed of an integrated circuit may also depend on a supply voltage ("V") applied to the integrated circuit and a temperature ("T") of the integrated circuit. The operating speed may increase as the manufacturing parameter (M) increases, the supply voltage (V) increases, and/or the temperature (T) decreases. Conversely, the operating speed may decrease as the manufacturing parameter (M) decreases, the supply voltage (V) decreases, and/or the temperature (T) increases. This dependency of the operating speed on M, V, and T is shown in Table 1 below.

TABLE 1

| MVT Parameters | Power Consumption | Maximum Operating Frequency |
| --- | --- | --- |
| Low Temperature | Decreased | Increased |
| High Temperature | Increased | Decreased |
| Low Supply Voltage | Decreased | Decreased |
| High Supply Voltage | Increased | Increased |
| "Slow" M Parameter | Decreased | Decreased |
| "Fast" M Parameter | Increased | Increased |

There may be a point of M, V, and T where the operating speed is lowest, and this point may be referred to as a "slow corner." Meanwhile, there may be another point of M, V, and T where the operating speed is greatest, and this point may be referred to as a "fast corner." An operating domain of M, V, and T may be defined between the slow corner and fast corner. The operating domain may include values of M that are between the slow value of M at the slow corner and the fast value of M at the fast corner, values of V that are between the low value of V at the slow corner and the high value of V at the fast corner, and values of T that are between the high value of T at the slow corner and the low value of T at the fast corner. This operating domain of M, V, and T may also be referred to as an "operating window."

Variations in the manufacturing conditions may cause differences in operating speed among the integrated circuits. If an application attempts to drive an integrated circuit at a clock speed that is faster than the operating speed of the integrated circuit, the integrated circuit may malfunction and therefore may not be relied upon in an application. Thus, the application may have to drive the integrated circuit at a sufficiently low clock speed that the integrated circuit continues to operate within the operating window to ensure proper functioning. However, this assumption that the integrated circuit operates at its worst-case-scenario speed may lead the application to drive the majority of integrated circuits at clock speeds that are significantly lower than the operating speeds that these integrated circuits are actually capable of.

The slowness of one integrated circuit in comparison to another integrated circuit of the same design and intended function may also cause timing problems. For example, the integrated circuit may be coupled to external circuitry that expects to receive data from the integrated circuit according to an external clock. The slowness of an integrated circuit may cause a mismatch between when the integrated circuit generates data and a window of time during which the external circuitry expects to receive that data. This mismatch, which can be referred to as an "AC timing asymmetry," may cause a malfunction of the application that interfaces the integrated circuit with the external circuitry.

Variations in the manufacturing conditions may also cause differences in the amount of power consumed by an integrated circuit. If a package for an integrated circuit die does not have sufficient heat dissipation capability, the temperature of the integrated circuit may exceed its allowable operating point and the integrated circuit may malfunction. Thus, the integrated circuit die may need to be encapsulated in a package with heat dissipation capabilities that are sufficient to dissipate heat that is expected from the worst-case scenario. However, reliance on the assumption that an integrated circuit is operating at its worst-case scenario power consumption may lead to an application utilizing a more expensive package than would be necessary for the majority of integrated circuits on their own.

Figure 1:
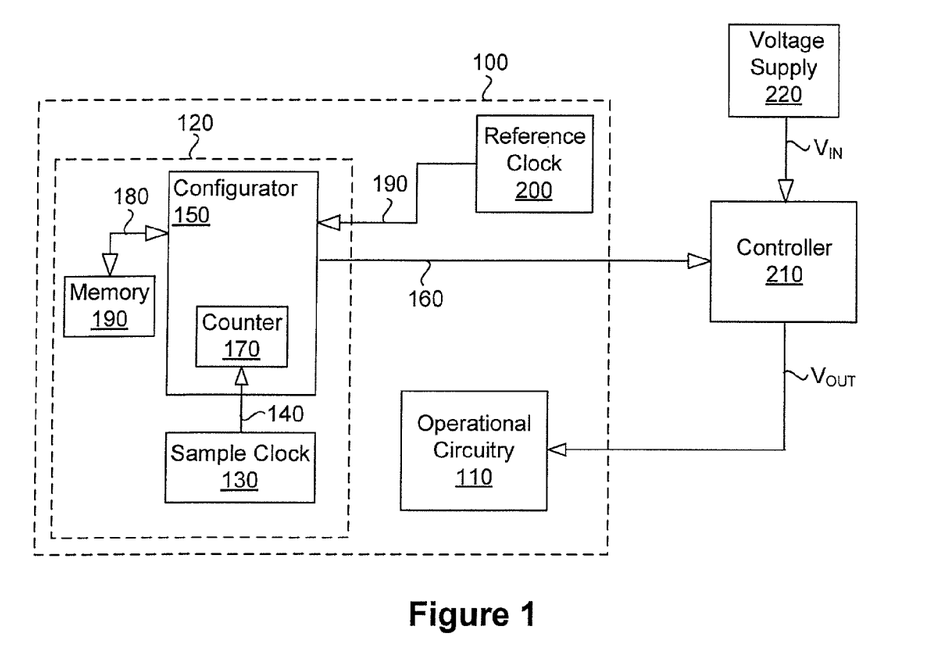
FIG. 1 is a block diagram of an integrated circuit that includes an operational regulator to control a supply voltage for operational circuitry of the integrated circuit in accordance with an embodiment of the invention.

FIG. 1 is a block diagram of an integrated circuit 100 having operational circuitry 110 to electrically perform one or more operations. Each of the lines connecting components in FIG. 1 represents one or more couplings between those components. Additional components or couplings that are not shown in FIG. 1 may be used to implement the electrical circuitry described in the corresponding text, as would be apparent to one of ordinary skill in the art based on the instant description. For example, the electrical circuitry may incorporate one or more oscillators, diodes, capacitors, resistors, field-effect transistors (FETs), jumpers, and sockets or other connectors. The components and couplings shown in FIG. 1 are provided only to illustrate teaching principles, and should not be used to limit the scope of the invention or its equivalents to the embodiments provided herein as examples.

An operational regulator 120 is provided to regulate one or more operating conditions of operational circuitry 110 to compensate for manufacturing variations of integrated circuit 100. By regulating these operating conditions, the operating window for integrated circuit 100 can be improved. Operational regulator 120 may include, for example, a sample clock 130 to generate a sample clock signal 140 that correlates to the operating speed of operational circuitry 110. Sample clock 130 may have been manufactured together with operational circuitry 110 under substantially the same manufacturing conditions, and may therefore substantially share the performance characteristics of operational circuitry 110. In accordance with an embodiment, sample clock 130 may include an oscillator to generate an oscillating sample clock signal 140. The oscillator may include a digital ring oscillator (DRO), such as an inverter ring oscillator, to generate sample clock signal 170.

Operational regulator 120 may also include a configurator 150 to evaluate sample clock signal 140 from sample clock 130 and generate an appropriate configuration, embodied in a configuration signal 160. In accordance with an embodiment, configurator 150 is adapted to evaluate sample clock signal 140 with reference to a reference clock signal 190 supplied by a reference clock 200. Reference clock 200 may produce a reference clock signal that is substantially independent of one or both of the manufacturing parameter (M) and the temperature (T) of integrated circuit 100. For example, reference clock 200 may include a crystal oscillator that outputs a clock signal having a substantially constant frequency.

Configurator 150 may include a counter 170 to receive sample clock signal 140 from sample clock 130 and generate a corresponding count value. For example, counter 170 may count a number of phase changes of sample clock signal 140 that occur during a predefined time period to obtain the count value. The predefined time period during which counter 170 counts the phase changes of sample clock signal 140 may correspond to a predefined number of phase changes of reference clock signal 190. Sample data 180 may be generated based on sample clock signal 140. For example, sample data 180 may include the count value. Sample data 180 may alternatively or additionally include a value of a parameter that is derived from or otherwise related to the count value, so as to permit operational regulator 120 to model the effect of adjustment of an operating condition on the operating speed, power consumption, or timing of operational circuitry 110. Configurator 150 may evaluate sample clock signal 140 from sample clock 130 substantially periodically to permit operational regulator 120 to continuously regulate the operating conditions of integrated circuit 100.

A reference value of sample data 180 may be determined at reference conditions that include known values of the supply voltage ($V_{OUT}$) and temperature (T) of integrated circuit 100, such as in a controlled environment. The reference value of sample data 180 may include the count value obtained from sample clock 130 under these reference conditions. Alternatively or in addition, the reference value of sample data 180 may include a value of a parameter that is derived from or otherwise related to the count value, such as a determined value of the manufacturing parameter (M) of integrated circuit 100. Since the count value is indicative of the operating speed of operational circuitry 110, the value of the manufacturing parameter (M) may be derived at least approximately from the count value obtained under the reference conditions described above. For example, the value of the manufacturing parameter (M) may be determined by calculation, approximation, or use of a lookup table based on this count value and the known reference conditions.

Operational regulator 120 may further include a memory 190 to store one or more values of sample data 180, such as for example the reference value of sample data 180. Configurator 150 may be coupled to memory 190 to read these values of sample data 180 from memory 190. Memory 190 may include non-volatile memory to retain the one or more values of sample data 180 regardless of whether power is being supplied to integrated circuit 100, such as to retain these values for the lifetime of integrated circuit 100. The non-volatile memory may include, for example, programmable fuse (eFuse), Electrically Erasable Programmable Read-Only Memory (EEPROM), Flash memory, or other suitable memory device.

After configurator 150 has stored the reference value of sample data 180 in memory 190, configurator 150 may determine target values of one or more operating conditions to be regulated according to a desired operation of operational circuitry 110 within the operating window. Configurator 150 may include one or more comparators to compare a current value of sample data 180 to one or more threshold levels to establish a configuration. Based on this comparison, configurator 150 may generate a corresponding configuration signal 160. For example, configurator 150 may access a lookup table that correlates different threshold levels for the current value of sample data 180 to different configurations. The threshold levels may be inputted to the comparators as respective voltage levels. For example, the threshold levels used by the comparators may be preset when configurator 150 is manufactured, such as when integrated circuit 100 is manufactured. Alternatively, the threshold levels may be modified in real time after configurator 150 has been manufactured, such as by a customer or application that uses integrated circuit 100.

Operational regulator 120 may further include a controller 210 coupled to configurator 150 to receive configuration signal 160 from configurator 150 and control the operating conditions of integrated circuit 100 according to configuration signal 160. Controller 210 may additionally be adapted to initially control the one or more operating conditions of integrated circuit 100 according to a predefined configuration before configurator 150 can establish any configuration based on sample clock signal 140. Controller 210 may include one or more input terminals to receive input signals that define an initial configuration. For example, one or more dual in-line package (DIP) switches or jumper blocks may be provided to assist a human user in manually setting the initial configuration and adjusting the input signals received by controller 210. Setting the initial configuration may enable controller 210 to control the operating conditions of integrated circuit 100 in a predefined manner before sample clock signal 140 can be generated and evaluated.

In accordance with an embodiment, operational regulator 120 may regulate the supply voltage ($V_{OUT}$) of integrated circuit 100. Operational regulator 120 may regulate a voltage ("$V_{IN}$") supplied to operational regulator 120 from an external voltage supply 220, although this need not be the case. The regulated supply voltage ("$V_{OUT}$") is then supplied to operational circuitry 110 of integrated circuit 100. For example, configurator 150 may determine a value of the supply voltage ($V_{OUT}$) that corresponds to a desired value of the operating speed at the current temperature (T).

For example, for an integrated circuit with a slow value of the manufacturing parameter (M), the supply voltage ($V_{OUT}$) may be safely increased without impinging on the maximum power dissipation of the integrated circuit package since an integrated circuit with a slow value of the manufacturing parameter (M) consumes less power than an integrated circuit with a fast value of the manufacturing parameter (M). This increase in the supply voltage also increases the operating speed of integrated circuit 100. Conversely, for an integrated circuit with a fast value of the manufacturing parameter (M), the supply voltage ($V_{OUT}$) may be safely decreased without endangering proper operation at the desired operating frequency, thus allowing the power dissipation capability of the package to be decreased.

In accordance with an embodiment, operational regulator 120 may determine a desired level of the supply voltage ($V_{OUT}$) of integrated circuit 100 at a single instance. For example, a desired initial level of the supply voltage ($V_{OUT}$) may be derived from sample data 180 during an initial testing of integrated circuit 100, after the manufacturing process and under a controlled supply voltage ($V_{OUT}$) and temperature (T). In accordance with another embodiment, operational regulator 120 may periodically determine the target level of the supply voltage ($V_{OUT}$) of integrated circuit 100 as the temperature (T) changes.

Controller 210 may include a voltage regulator to regulate a level of the supply voltage ($V_{OUT}$) in accordance with configuration signal 160 received from configurator 150. Controller 210 may increase the supply voltage ($V_{OUT}$) to increase the operating speed of integrated circuit 100 according to the known relationship described above. For example, operational regulator 120 may configure controller 210 to increase the supply voltage ($V_{OUT}$) in order to enable an integrated circuit 100 with a relatively slow value of the manufacturing parameter (M) to operate at a desirably high speed. Conversely, controller 210 may decrease the supply voltage ($V_{OUT}$), which may incidentally decrease the operating speed. For example, operational regulator 120 may configure controller 210 to decrease the supply voltage ($V_{OUT}$) in order to decrease excess heat and power consumption of integrated circuit 100 if integrated circuit 100 has a relatively fast value of the manufacturing parameter (M).

Figure 2:
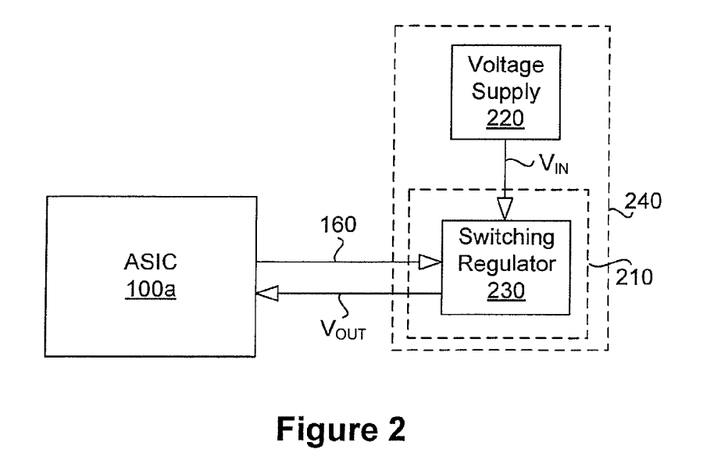
FIG. 2 is a block diagram of an integrated circuit that includes an operational regulator to control a supply voltage for operational circuitry of the integrated circuit in accordance with another embodiment of the invention.

FIG. 2 is a block diagram of an integrated circuit 100 with an operational regulator 120 that is implemented in an application-specific integrated circuit (ASIC) 100a in accordance with an embodiment of the present disclosure. ASIC 100a may generate an appropriate configuration signal 160 for controller 210. For example, configurator 150 may generate a digital configuration signal 160 for controller 210.

Controller 210 may include a switching regulator 230, such as shown in FIG. 2. For example, switching regulator 230 may be a component of a switching power supply 240 that also includes voltage supply 220 to produce a regulated supply voltage ($V_{OUT}$). Switching regulator 230 may be a Marvell PN 88PG8X18 family regulator, available from Marvell Semiconductor, Inc., Santa Clara, Calif., for example. Switching regulator 230 may include a serial port to receive configuration signal 160.

In accordance with another embodiment, controller 210 may include a linear regulator to regulate the supply voltage. For example, the linear regulator may be a LM1117, which is available from National Semiconductor Corporation, Santa Clara, Calif. Similar linear regulators available from other vendors may also be suitable.

Figure 3A:
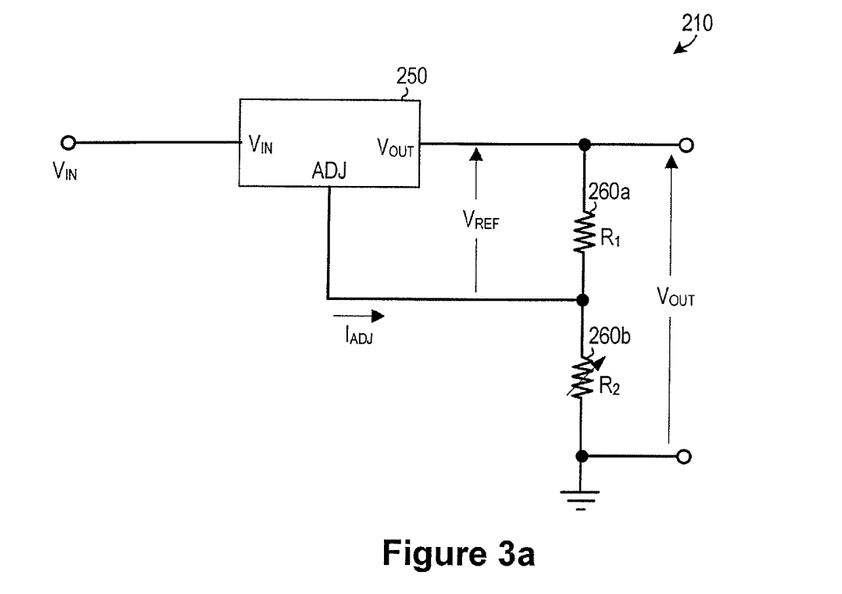
FIG. 3a is a schematic diagram of a controller to control a supply voltage for operational circuitry of an integrated circuit in accordance with an embodiment of the invention.

FIG. 3a is a schematic diagram of an embodiment of a controller 210 that includes a linear regulator 250. The electrical circuitry shown in FIG. 3a is provided only to illustrate teaching principles consistent with the present disclosure, and should not be used to limit the scope of the invention or its equivalents to the embodiments provided herein. Linear regulator 250 may have a voltage input terminal to receive an input voltage ($V_{IN}$), a voltage output terminal to output a supply voltage ($V_{OUT}$), and an adjustment terminal (ADJ) to receive an adjustment voltage. In the embodiment shown for example in FIG. 3a, resistors are arranged in series to provide an adjustment voltage to the adjustment terminal (ADJ) of linear regulator 250. A first resistor 260a having resistance $R_1$ and a second resistor 260b having resistance $R_2$ may be coupled in series. Second resistor 260b may be a variable resistor to enable control of the adjustment voltage that is provided to the adjustment terminal (ADJ) of linear regulator 250. The supply voltage ($V_{OUT}$) of the configuration shown in FIG. 3a for linear regulator 250 may be controlled by adjusting the $R_2$ resistance. The supply voltage ($V_{OUT}$) may be determined according to Equation 1 below, where $V_{REF}$ is the voltage across first resistor 260a and $I_{ADJ}$ is the current at the adjustment terminal (ADJ) of linear regulator 250:

$$V_{OUT} = V_{REF} \cdot \left(1 + \frac{R2}{R1}\right) + I_{ADJ} \cdot R2 \quad (1)$$

Figure 3B:
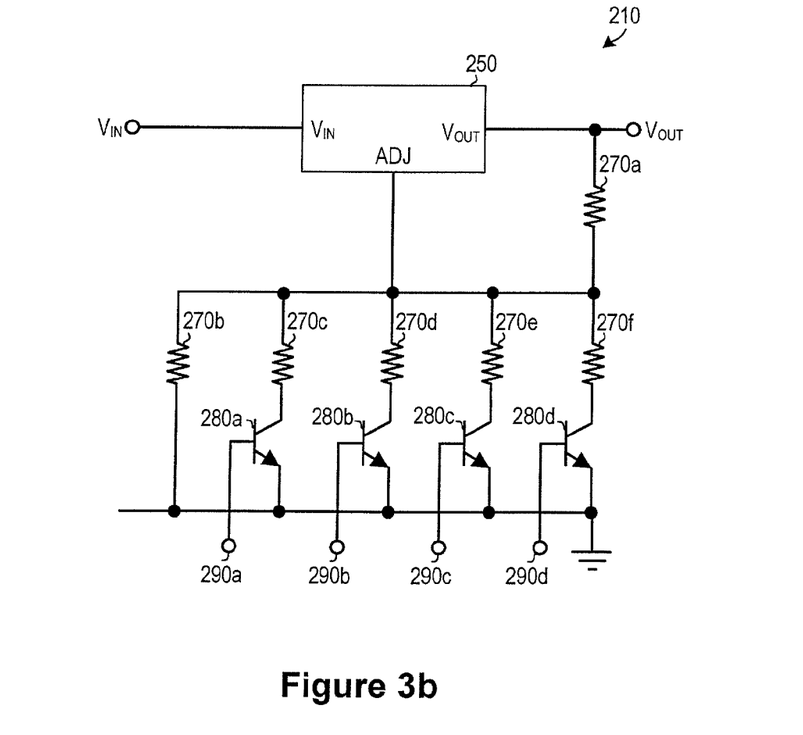
FIG. 3b is a schematic diagram of a controller to control a supply voltage for operational circuitry of an integrated circuit in accordance with another embodiment of the invention.

FIG. 3b is a schematic diagram of a configuration of controller 210 including linear regulator 250 in accordance with another embodiment of the disclosure. A first resistor 270a and a set of second resistors 270b-270f may be coupled in series. In this embodiment, the second resistors 270b-270f in the set may be arranged in parallel to provide an adjustment voltage to the adjustment terminal of linear regulator 250. One or more of second resistors 270b-270f may be activated or deactivated to control the effective resistance of the set of second resistors in parallel and thereby control the output voltage ($V_{OUT}$). For example, transistors 280a-280d may be coupled to resistors 270c-270f, respectively. Signals may be applied to transistors 280a-280d at nodes 290a-290d, respectively, to activate or deactivate the individual resistors 270c-270f, respectively, in relation to linear regulator 250. In an embodiment, open-drain pad drivers from an ASIC may be used to activate or deactivate the individual resistors 270c-270f.

In addition to or alternatively to regulating the voltage supply that is supplied to operating circuitry 110 of integrated circuit 100, operational regulator 120 may be configured to regulate other operating conditions of integrated circuit 100 to compensate for variations in manufacturing parameters. For example, operational regulator 120 may regulate a phase of an operational clock signal that is supplied to and used by operating circuitry 110 of integrated circuit 100.

Figure 4:
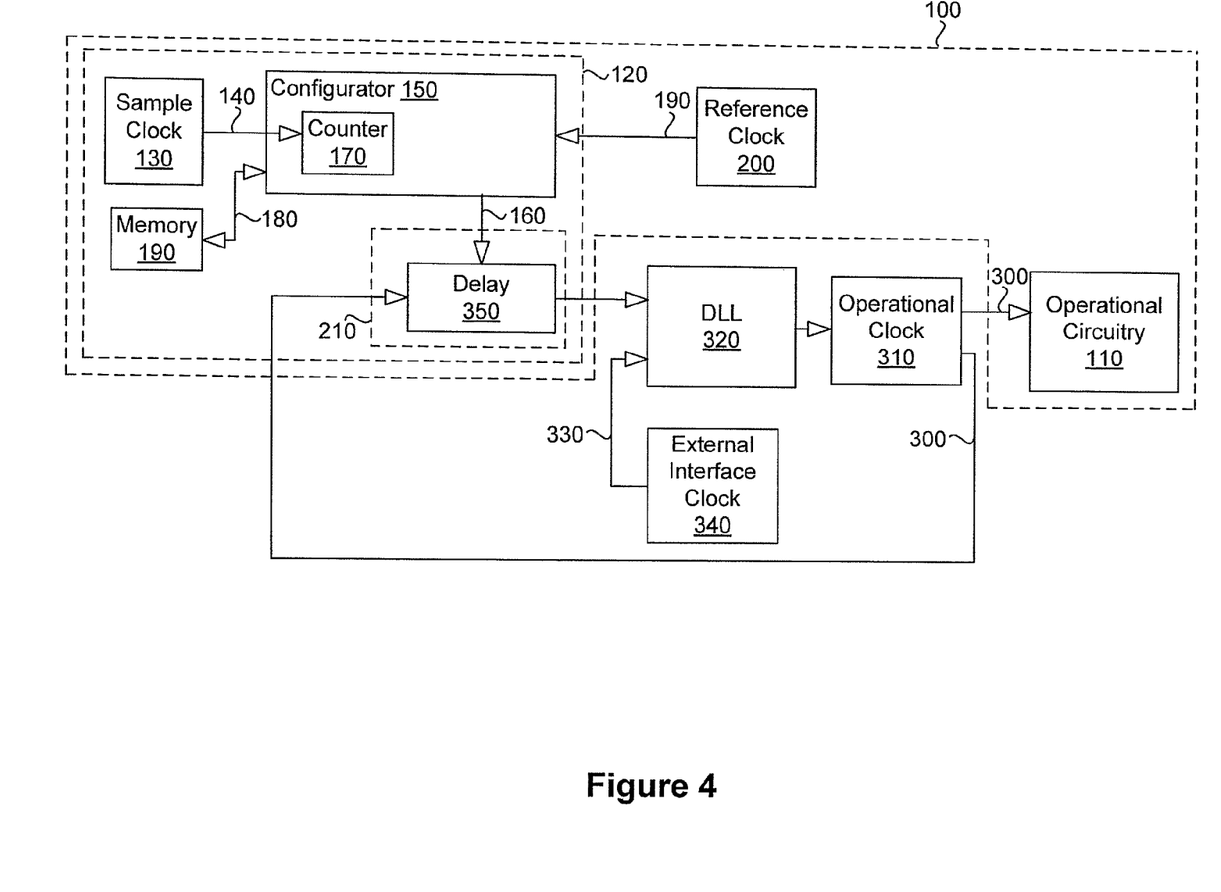
FIG. 4 is a block diagram of an integrated circuit that includes an operational regulator to control a phase of a clock signal for operational circuitry of the integrated circuit in accordance with another embodiment of the invention.

FIG. 4 is a block diagram of an embodiment of integrated circuit 100 and controller 210 for regulating the phase of an operational clock signal 300 that is supplied to operational circuitry 110 of integrated circuit 100. An operational clock 310 may be provided to supply operational clock signal 300. A delay-locked loop (DLL) 320 may be provided to attempt to match a phase of operational clock signal 300 to a phase of an external interface clock signal 330 that is received by DLL 320 from external interface clock 340. Alternatively to DLL 320, controller 210 may include a phase-locked loop (PLL) (not shown) to control the frequency and phase of operational clock signal 300. In one example, operational clock 310 includes a voltage-controlled oscillator (VCO).

Configurator 150 may further include an adjustable delay element 350 coupled to DLL 320 to introduce a phase shift to operational clock signal 300. Controller 210 may configure adjustable delay element 350 to adjust the amount of phase shift that is applied to operational clock signal 300. For example, operational clock signal 300 may be phase shifted forward or backward in relation to external interface clock signal 330. In this manner, operational regulator 120 can correct for the AC timing asymmetry described above.

Configurator 150 and controller 210 may be implemented on the same die as integrated circuit 100 containing operational circuitry 110, or one or both of configurator 150 and controller 210 may be implemented external to the die of integrated circuit 100. For example, controller 210 may include an on-die regulator (ODR) that is implemented on the same die as integrated circuit 100. Furthermore, configurator 150 and controller 210 may be housed in the same package as integrated circuit 100, or one or both of configurator 150 and controller 210 may alternatively be implemented external to the package that houses integrated circuit 100. The functions of sample clock 130, configurator 150, and controller 210 may be implemented together or separately, and as part of one or more physical components, as would be suitable for the desired application. For example, tasks described herein as performed by configurator 150 may alternatively be performed by controller 210, or vice versa. Moreover, one or more of the functions of configurator 150 may be implemented in hardware, firmware, software, or any suitable combination thereof.

Figure 5:
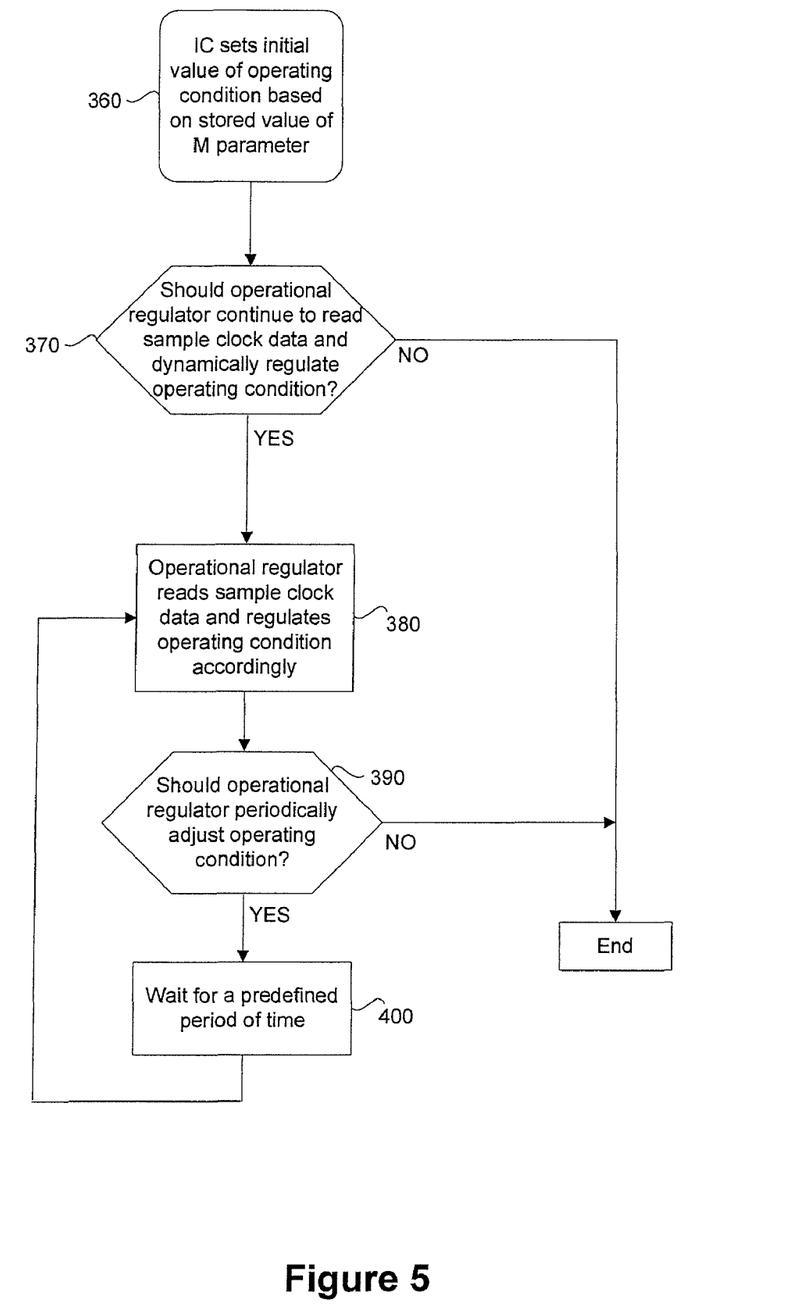
FIG. 5 is a flow chart of a method for regulating an integrated circuit in accordance with an embodiment of the invention.

FIG. 5 is a flow chart of a method for regulating an operating condition of an integrated circuit in accordance with an embodiment of the invention. In FIG. 5, the rectangular boxes represent processes of the method, whereas the hexagonal boxes represent conditional branches of the method. To initially measure the value of the manufacturing parameter (M), sample clock data may be obtained from the sample clock. Based on known values of the supply voltage ($V_{OUT}$) and temperature (T) under controlled conditions, the value of the manufacturing parameter (M) may be determined from the count value, as described above. Based on the known value of the manufacturing parameter (M), an initial value of the operating condition (such as, for example, the supply voltage or a phase shift of a clock signal) may be set to improve the performance of the operational circuitry in one or more ways, as shown by step 360. It may be determined whether the operational regulator should continue to read sample clock data and dynamically regulate this operating condition, as shown by conditional branch 370. If 'no', the process of operational regulation may end, as shown in FIG. 5.

However, if 'yes' then the process of operational regulation continues. The operational regulator may once again read the sample clock data and dynamically regulate the operating condition based on a change in the sample clock data, as shown by step 380. It may then be determined whether the operational regulator should periodically adjust the operating condition, as shown by conditional branch 390. If 'no' then the process of operational regulation may end, as shown in FIG. 5. However, if 'yes' then the operational regulator may wait for a predefined period of time, as shown by step 400. The process may then repeat beginning at step 380, as shown in FIG. 5.

As explained above, an operational regulator consistent with the present invention may improve the regulation of one or more operating conditions of an integrated circuit. For example, operational regulator 120 may regulate these operating conditions of integrated circuit 100 in substantially real time during operation. Operational regulator 120 may regulate integrated circuit 100 to achieve a desired operating speed, as well as avoiding overheating and excessive power consumption during operation. Moreover, operational regulator 120 may regulate integrated circuit 100 to operate in synchrony with timing requirements of external circuitry.

Although teaching embodiments have been described in considerable detail, other versions are possible. For example, the integrated circuit may comprise other electronic circuitry equivalent in function to the illustrative structures herein. Furthermore, relative or positional terms, such as "first" and "second," are used with respect to the embodiments described and may be interchangeable. Therefore, the appended claims should not be limited to the description of the versions contained herein.

What is claimed is:

1. An integrated circuit comprising:
    operational circuitry configured to perform an operation in accordance with an operating condition; and
    an operational regulator comprising:
        a sample clock configured to generate a sample clock signal, the sample clock (i) having been previously manufactured together with the operational circuitry and (ii) substantially sharing a performance characteristic of the operational circuitry such that the sample clock signal correlates to a manufacturing variation of the operational circuitry; and
        a configurator configured to (i) perform an evaluation of the sample clock signal, and (ii) generate a configuration signal for a controller according to the evaluation,
    wherein an operational clock is configured to generate, based on an intermediate clock signal, an operational clock signal, and
    wherein the controller is configured to generate, based on the configuration signal, the intermediate clock signal by introducing a phase shift to the operational clock signal.

2. An integrated circuit according to claim 1, wherein the sample clock comprises a digital ring oscillator (DRO).

3. An integrated circuit according to claim 1, wherein the controller comprises an on-die regulator (ODR) that is implemented on the same die as the operational regulator.

4. An integrated circuit according to claim 1, wherein the operational regulator further comprises a non-volatile memory to store sample data corresponding to a frequency of the sample clock signal.

5. An integrated circuit according to claim 1, further comprising a reference clock providing a reference clock signal to the configurator, wherein the reference clock signal is substantially independent of the manufacturing variation and an operating temperature.

6. An integrated circuit according to claim 5, wherein the reference clock comprises a crystal oscillator.

7. An operational regulator for regulating an operating condition of an integrated circuit, the operational regulator comprising:
    a sample clock to generate a sample clock signal, the sample clock (i) having been previously manufactured together with the operational circuitry and (ii) substantially sharing a performance characteristic of the operational circuitry such that the sample clock signal correlates to a manufacturing variation of the integrated circuit; and
    a configurator configured to (i) perform an evaluation of the sample clock signal, and (ii) generate a configuration signal for a controller according to the evaluation,
    wherein an operational clock is configured to generate, based on an intermediate clock signal, an operational clock signal, and
    wherein the controller is configured to generate, based on the configuration signal, the intermediate clock signal by introducing a phase shift to the operational clock signal.

8. An operational regulator according to claim 7, wherein the sample clock comprises a digital ring oscillator (DRO).

9. An operational regulator according to claim 7, wherein the controller comprises an on-die regulator (ODR) that is implemented on the same die as the operational regulator.

10. An operational regulator according to claim 7, wherein the controller comprises (i) a delay-locked loop (DLL) or phase-locked loop (PLL) and (ii) an adjustable delay element to control a phase of an operational clock signal for the integrated circuit.

11. An operational regulator according to claim 7, further comprising a non-volatile memory to store sample data corresponding to a frequency of the sample clock signal.

12. An operational regulator according to claim 7, further comprising a reference clock providing a reference clock signal to the configurator, wherein the reference clock signal is substantially independent of the manufacturing variation and an operating temperature.

13. An operational regulator according to claim 12, wherein the reference clock is provided by a crystal oscillator.

14. A method of regulating an operating condition of an integrated circuit, the method comprising:
   generating a sample clock signal via a sample clock, the sample clock (i) having been previously manufactured together with the integrated circuit and (ii) substantially sharing a performance characteristic of the integrated circuit such that the sample clock signal correlates to a manufacturing variation of the integrated circuit;
   performing an evaluation of the sample clock signal, and generating a configuration signal according to the evaluation;
   generating, based on an intermediate clock signal, an operational clock signal; and
   generating, based on the configuration signal, the intermediate clock signal by introducing a phase shift to the operational clock signal.

15. A method according to claim 14, wherein generating the sample clock signal comprises operating a digital ring oscillator (DRO).

16. A method according to claim 14, wherein controlling the operating condition comprises controlling a phase of an operational clock signal for the integrated circuit.

17. A method according to claim 14, wherein:
   performing the evaluation of the sample clock signal comprises counting phase changes of the sample clock signal, and
   generating the configuration signal comprises outputting a configuration signal in response to the counted phase changes.

18. A method according to claim 14, wherein performing the evaluation of the sample clock signal comprises evaluating the sample clock signal with reference to a reference clock signal that is substantially independent of the manufacturing variation and an operating temperature.

* * * * *